United States Patent
Lu et al.

(10) Patent No.: US 7,741,901 B2
(45) Date of Patent: Jun. 22, 2010

(54) CIRCUIT FOR CHARGING A BOOTSTRAP CAPACITOR IN A VOLTAGE CONVERTER

(75) Inventors: Sao-Hung Lu, Taoyuan (TW); Isaac Y. Chen, Jubei (TW)

(73) Assignee: Richtek Technology Corp., Hsinchu (TW)

(*) Notice: Subject to any disclaimer, the term of this patent is extended or adjusted under 35 U.S.C. 154(b) by 122 days.

(21) Appl. No.: 12/068,253

(22) Filed: Feb. 5, 2008

(65) Prior Publication Data
US 2008/0218141 A1    Sep. 11, 2008

(30) Foreign Application Priority Data
Feb. 8, 2007    (TW) .............. 96104639 A

(51) Int. Cl.
*H02M 3/07*    (2006.01)
*G05F 1/613*    (2006.01)

(52) U.S. Cl. .................... 327/589; 323/224

(58) Field of Classification Search ............. 327/589; 323/283, 284, 224, 266
See application file for complete search history.

(56) References Cited

U.S. PATENT DOCUMENTS 6,396,251 B2 *   5/2002   Corva et al. .......... 323/283

* cited by examiner

*Primary Examiner*—Shawn Riley
(74) *Attorney, Agent, or Firm*—Rosenberg, Klein & Lee

(57) ABSTRACT

For charging a bootstrap capacitor in a voltage converter, a circuit is provided for wider bandwidth to eliminate the feedback stability issue and pin out for compensation circuit. A pair of transistors are connected in series between a power input and the bootstrap capacitor, the first transistor is switched synchronously with a low-side transistor of the voltage converter, and a comparator compares a feedback voltage drawn from a feedback node between the pair of transistors with a reference voltage, to control the second transistor to determine to charge the bootstrap capacitor.

5 Claims, 5 Drawing Sheets

US 7,741,901 B2

CIRCUIT FOR CHARGING A BOOTSTRAP CAPACITOR IN A VOLTAGE CONVERTER

FIELD OF THE INVENTION

The present invention is related generally to a voltage converter and, more particularly, to a circuit for charging a bootstrap capacitor in a voltage converter.

BACKGROUND OF THE INVENTION

FIG. 1 shows a part of a conventional voltage converter, in which a controller chip 10 has a high-side driver 102 and a low-side driver 104 for providing a high-side, drive signal UG and a low-side drive signal LG for a power stage of the voltage converter according to two control signals Ug-signal and Lg-signal, respectively, to switch a high-side transistor 14 and a low-side transistor 16 serially connected between a power source VIN and ground GND, so as to convert an input voltage VIN to an output voltage VOUT. If the supply voltage Vcc of the controller chip 10 is equal to the input voltage VIN, and the voltage converter of FIG. 1 has no diode 12 and bootstrap capacitor $C_{Bootstrap}$, the voltage supplied to the high-side power input Boot of the high-side driver 102 will be the supply voltage VIN. On the other hand, the maximum gate voltage UG of the high-side transistor 14 is equal to the high-side power input voltage $V_{Boot}$, since the gate voltage UG is provided by the high-side driver 102. As a result, the maximum gate voltage UG will be equal to the supply voltage VIN, and also the input voltage VIN applied to the drain of the high-side transistor 14. Therefore, when the high-side transistor 14 is turned on, and the low-side transistor 16 is turned off, the voltage on the switch node 18, i.e., the source voltage of the high-side transistor 14, will be equal to the input voltage VIN, and as a result, when the high-side driver 102 turns on the high-side transistor 14, the gate voltage UG and the source voltage of the high-side transistor 14 will be equal instantly, causing the high-side transistor 14 to be turned off instantly after it is turned on. For this reason, the conventional voltage converter employs a bootstrap capacitor $C_{Bootstrap}$ connected between the high-side power input Boot of the high-side driver 102 and the source of the high-side transistor 14, that is, between the boot node Boot and the switch node 18, for providing a sufficient voltage $V_{Boot}$ between the gate and the source of the high-side transistor 14 after turning on the high-side transistor 14.

As shown in FIG. 1, when the high-side transistor 14 is turned on, its gate voltage will be VIN+$V_{Boot}$, and there is always a difference $V_{Boot}$ between the gate voltage VIN+$V_{Boot}$ and the source voltage VIN of the high-side transistor 14 due to the presence of the bootstrap capacitor $C_{Bootstrap}$, so that the high-side transistor 14 can remain on. However, when the high-side transistor 14 is turned off and the low-side transistor 16 is turned on, the switch node 18 is grounded, the voltage on the switch node 18 changes to zero, and therefore the charges on the bootstrap capacitor $C_{Bootstrap}$ will be released, causing the voltage $V_{Boot}$ to decrease, so that the bootstrap capacitor $C_{Bootstrap}$ will need to be charged again to recover the voltage $V_{Boot}$ to its previous level. The conventional voltage converter further employs a diode 12 connected between the bootstrap capacitor $C_{Bootstrap}$ and the power source Vcc, so as to charge the bootstrap capacitor $C_{Bootstrap}$ by the power source Vcc and prevent reverse current. Usually, a Zener diode is used for the diode 12. If the diode 12 is outside of the controller chip 10, the system design will need an extra element, so it is preferred to set the diode 12 inside the controller chip 10 when designing the controller chip 10.

If the diode 12 is inside the controller chip 10, the voltage $V_{diode}$ it produces will be greater than that produced by a Zener diode outside of the controller chip 10, which may be about 1 Volt or more, causing the maximum voltage (Vcc−$V_{diode}$) supplied to the high-side power input Boot of the high-side driver 102 to be lower.

FIG. 2 shows a part of another conventional voltage converter, in which a transistor 202 with lower turn-on voltage $V_{ON}$, for example a MOSFET, is set inside the controller chip 20 to replace the diode 12 of FIG. 1, such that the maximum voltage (now Vcc−$V_{ON}$) on the boot pin Boot will be greater. The transistor 202 is controlled by a synchronous signal SYNC, so to be switched synchronously with the low-side transistor 24. When the high-side transistor 22 is turned off and the low-side transistor 24 is turned on, the transistor 202 is turned on by the synchronous signal SYNC, and the power source Vcc could charge the bootstrap capacitor $C_{Bootstrap}$. When the high-side transistor 22 is turned on and the low-side transistor 24 is turned off, the transistor 202 is turned off by the synchronous signal SYNC, to prevent from reverse current flowing from the boot node Boot to the power source Vcc, and the voltage on the boot node Boot remains VIN+$V_{Boot}$. Although this voltage converter is improved by removing the voltage $V_{diode}$ produced by the diode 12, the difference between the voltages on the boot node Boot and on the switch node 18 is fixed at Vcc−Von, lacking of adjustability, and the switching transistor 202 will cause additional switching loss.

FIG. 3 shows a part of yet another conventional voltage converter, in which an operational amplifier 302 and a transistor 304 are added for linear regulation so as to reduce switching loss, a transistor 308 controlled by a synchronous signal SYNC is switched synchronously with the low-side transistor 36, and a feedback voltage is produced by drawing the voltage from the node 306 and dividing with voltage divider resistors R1 and R2 for the operational amplifier 302 to compare with a reference voltage $V_{REF}$ to control the transistor 304. Only when the voltage on the node 306 is too low, the transistor 304 will connect the power source Vcc to the transistor 308 to charge the bootstrap capacitor $C_{Bootstrap}$. When being turned off, the transistor 308 will not cause switching loss. However, because the operational amplifier 302 needs compensation, an additional capacitor 32 is required as the compensation circuit, thereby requiring the controller chip 30 to have an extra pin $V_{DD}$.

SUMMARY OF THE INVENTION

An object of the present invention is to provide a circuit for charging a bootstrap capacitor in a voltage converter.

In a circuit for charging a bootstrap capacitor in a voltage converter according to the present invention, a pair of transistors are serially connected between a power input and the bootstrap capacitor, the first transistor is switched synchronously with a low-side transistor of the voltage converter, and a comparator compares a feedback voltage drawn from a feedback node between the pair of transistors with a reference voltage, to control the second transistor to determine to charge the bootstrap capacitor.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 4:
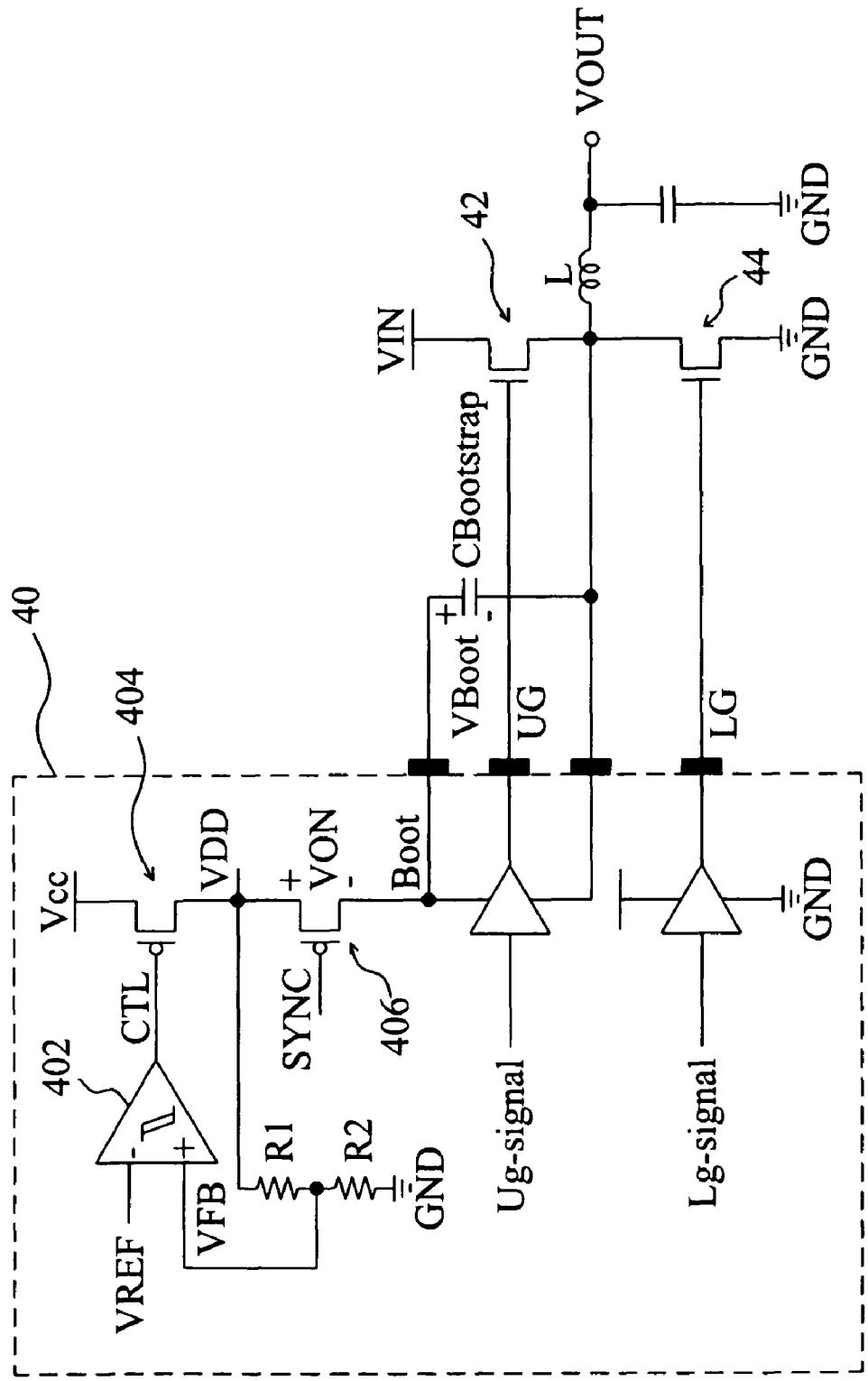
FIG. 4 shows an embodiment according to the present invention.

FIG. 4 shows an embodiment according to the present invention, in which a controller chip 40 is used to provide two drive signals UG and LG to switch a high-side transistor 42 and a low-side transistor 44 connected in series between a power input VIN and ground GND, in order to convert an input voltage VIN to an output voltage VOUT, and a bootstrap capacitor $C_{Bootstrap}$ is connected between a source of the high-side transistor 42 and a boot pin Boot of the controller chip 40 to provide a voltage $V_{Boot}$ therebetween when the high-side transistor 42 is on. In the controller chip 40, a comparator 402 is used to compare a feedback voltage $V_{FB}$ with a reference voltage $V_{REF}$ to produce a control signal CTL to control a transistor 404 connected between a power source Vcc and a feedback node $V_{DD}$, a transistor 406 is connected between the feedback node $V_{DD}$ and the boot pin Boot, and the boot pin Boot is also connected to the high-side power input of the high-side driver. The transistor 406 is switched by a synchronous signal SYNC synchronously with the low-side transistor 44. In this embodiment, the transistors 404 and 406 both are MOSFETs, while in other embodiments, other switch elements such as JFET may be used instead. For the comparator 402, a voltage $V_{DD}$ is drawn from the feedback node $V_{DD}$ and divided by voltage divider resistors R1 and R2 to produce the feedback voltage $V_{FB}$, upon which the comparator 402 determines whether to turn on the transistor 404. When the feedback voltage $V_{FB}$ is greater than the reference voltage $V_{REF}$, the transistor 404 is turned off; on the contrary, when the feedback voltage $V_{FB}$ is lower than the reference voltage $V_{REF}$, the transistor 404 is turned on so as to connect the supply voltage Vcc to the feedback node $V_{DD}$, thereby charging the bootstrap capacitor $C_{Bootstrap}$ when the transistor 406 is on.

Figure 1:
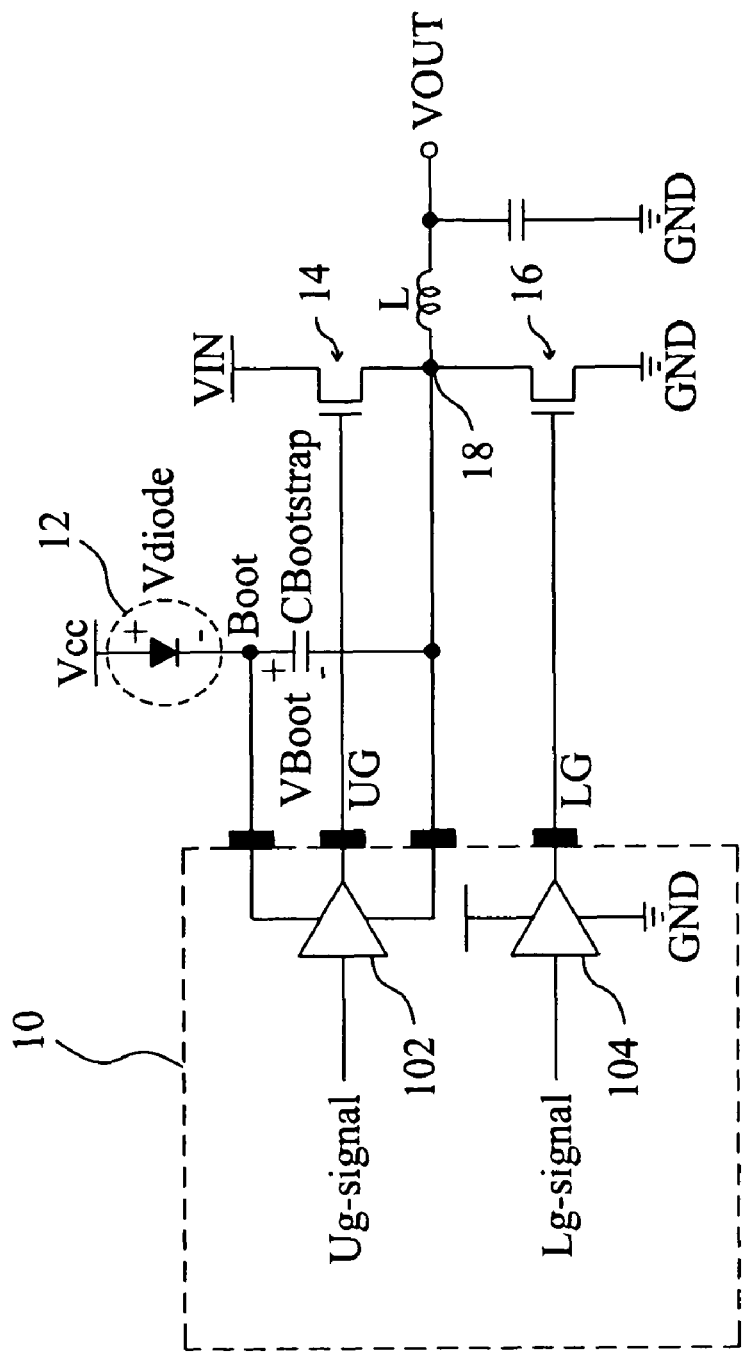
FIG. 1 shows a part of a conventional voltage converter.
Figure 2:
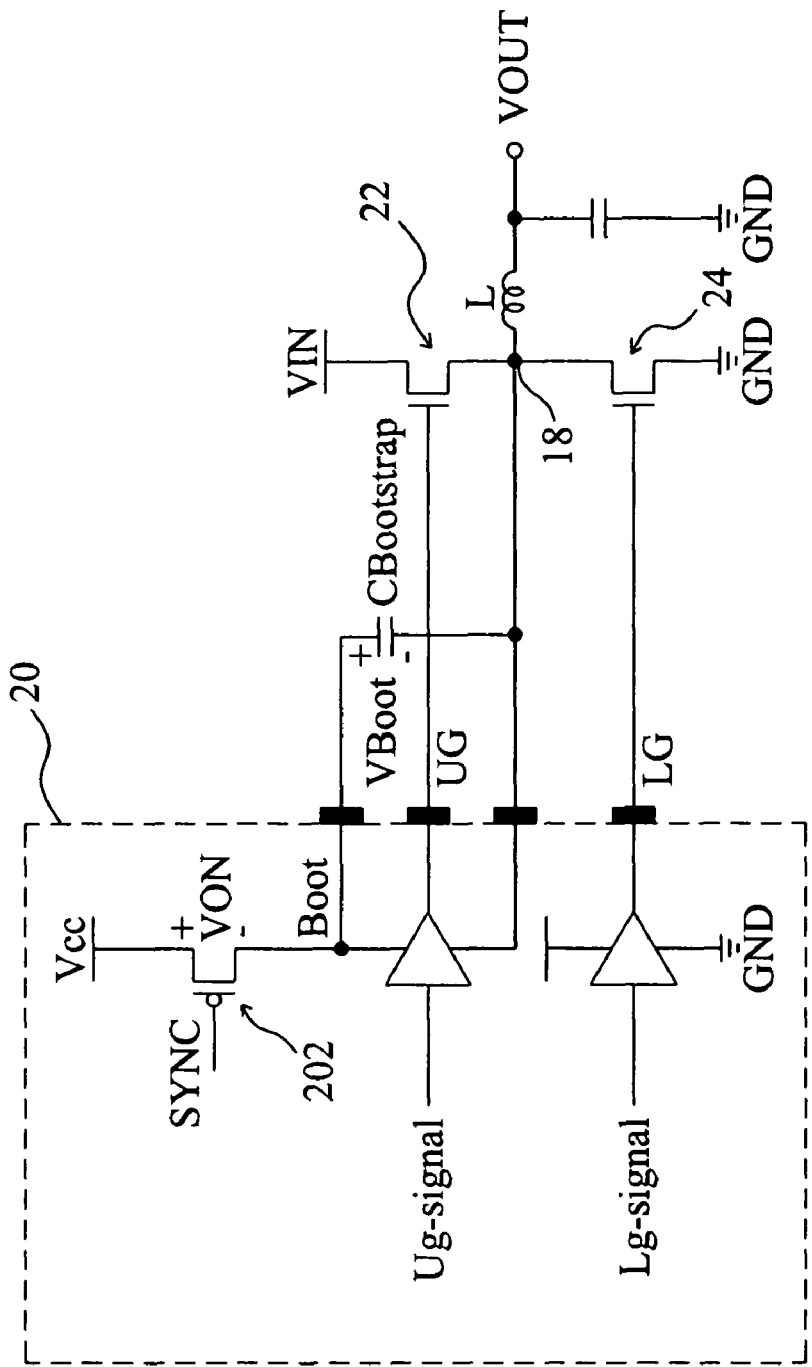
FIG. 2 shows a part of another conventional voltage converter.
Figure 3:
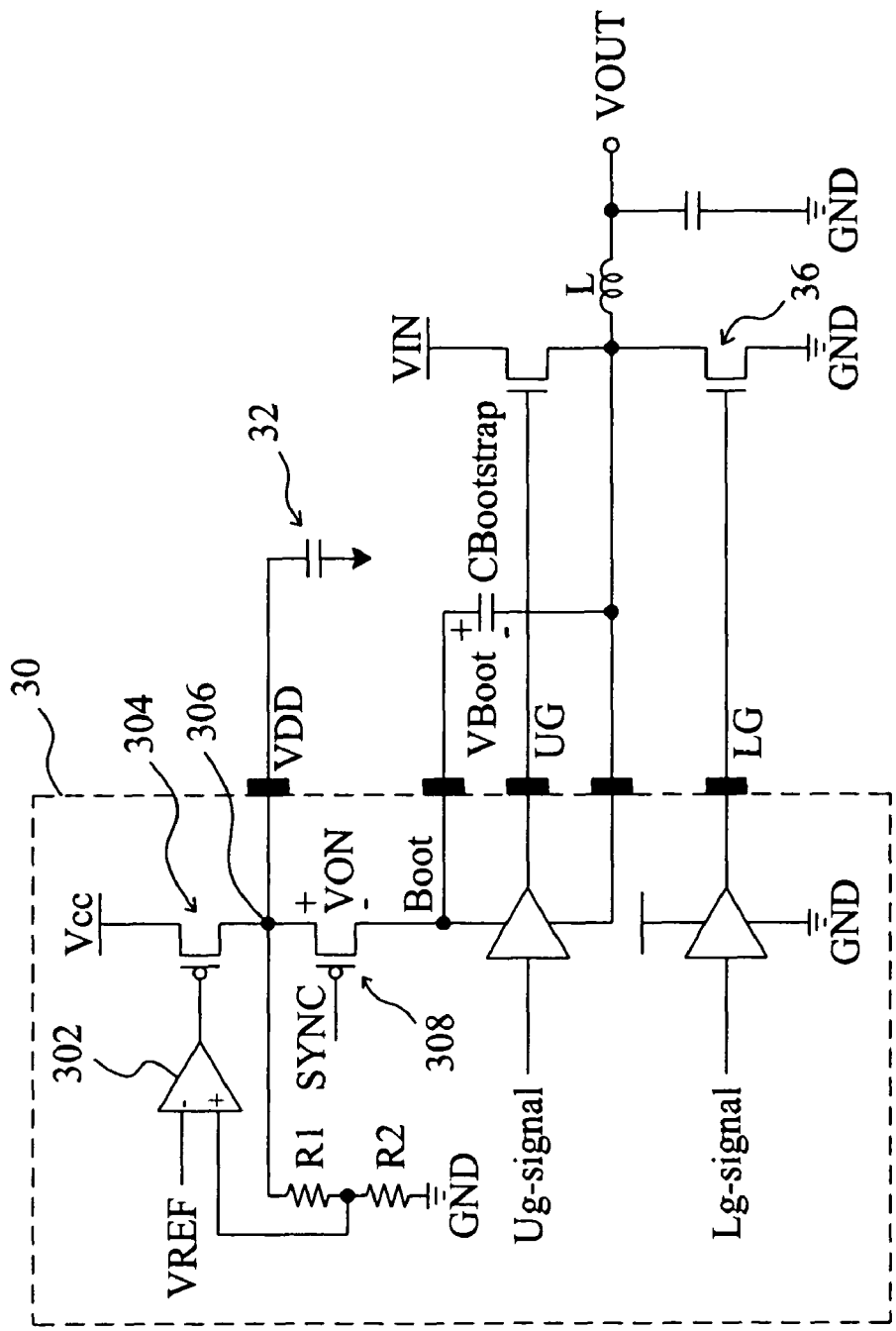
FIG. 3 shows a part of yet another conventional voltage converter.

Compared with the conventional voltage converter of FIG. 3, the controller chip 40 according to the present invention may also avoid the great dropout voltage $V_{diode}$ produced by the outside Zener diode 12 of FIG. 1 and the switching loss due to excessive switching of the transistor 202 of FIG. 2; however, because the comparator 402 of the controller chip 40 does not need compensation circuit, the controller chip 40 will not need the pin for the outside compensation capacitor 32 of FIG. 3. Moreover, an operational amplifier has slower response speed, so that the bandwidth compensated by a linear regulator such as that shown in FIG. 3 is shallower. Contrarily, a comparator has faster response speed, and therefore the bandwidth is wider. Preferably, the comparator 402 shown in FIG. 4 is a hysteretic comparator so as to increase the system stability.

Figure 5:
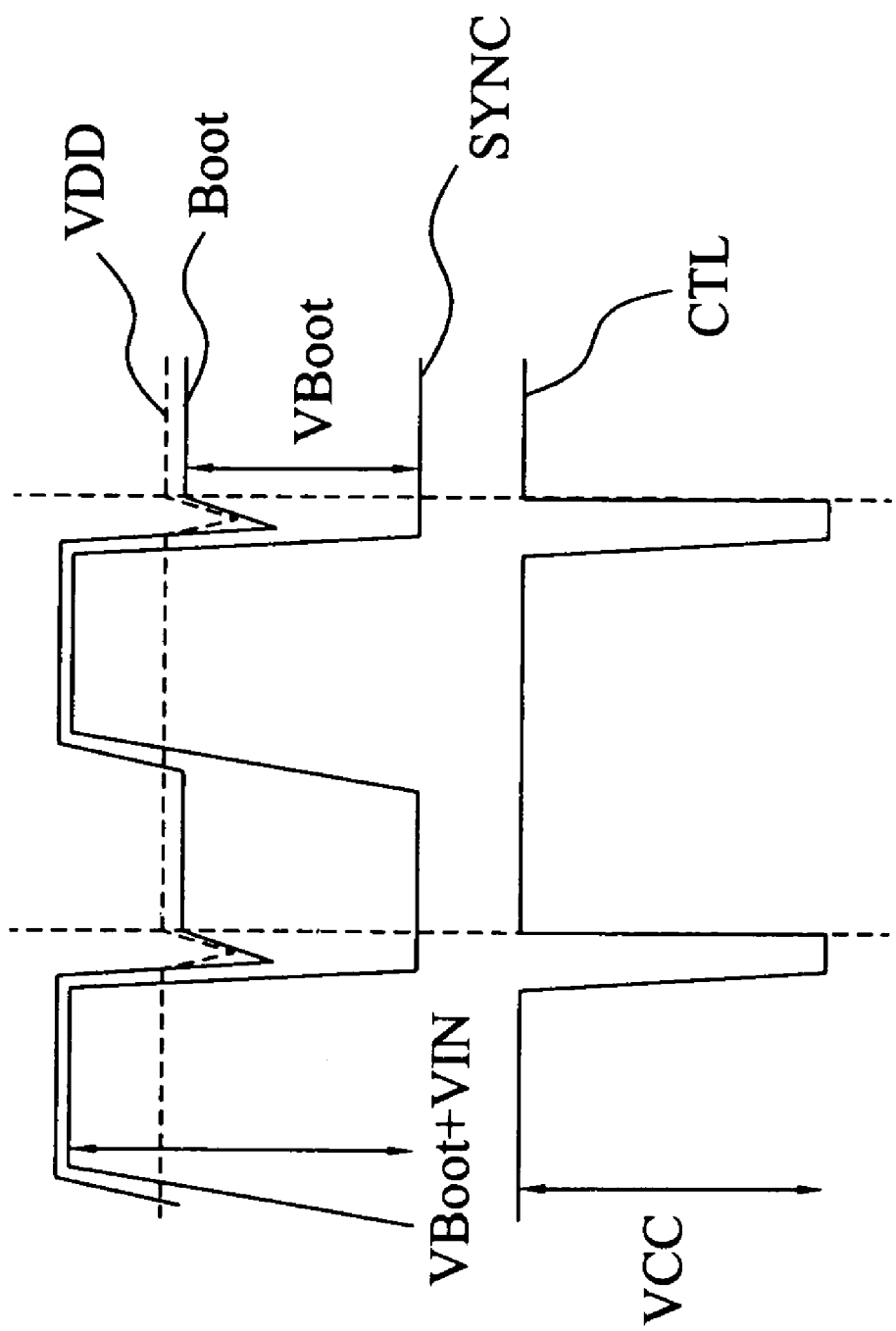
FIG. 5 is a waveform diagram showing signals in the circuit of FIG. 4.

FIG. 5 is a waveform diagram showing signals in the circuit of FIG. 4. The synchronous signal SYNC switches between high and low with a fixed frequency, and the voltage $V_{DD}$ is represented by a dotted line. With reference to FIGS. 4 and 5, when the synchronous signal SYNC is low, the low-side transistor 44 and the transistor 406 are turned on, the high-side transistor 42 is turned off, the source of the high-side transistor 42 is grounded through the low-side transistor 44, and the voltage on the pin Boot is $V_{Boot}$ which is also equal to $V_{DD}$–Von. When the synchronous signal SYNC is high, the low-side transistor 44 and the transistor 406 are turned off, the high-side transistor 42 is turned on, the source voltage of the high-side transistor 42 is VIN, and the voltage on the pin Boot is VIN+$V_{Boot}$. When the synchronous signal SYNC transits from high to low, a part of the charges on the bootstrap capacitor $C_{Bootstrap}$ will be released so as to cause the voltage $V_{DD}$ and the voltage on the pin Boot decreasing, and upon detecting the voltage $V_{DD}$, the comparator 402 will switch the control signal CTL from high to low once the feedback signal $V_{FB}$ decreases to cross over the reference voltage $V_{REF}$, thereby turning on the transistor 404 to connect the supply voltage Vcc to the feedback node $V_{DD}$ to charge the bootstrap capacitor $C_{Bootstrap}$.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A circuit for charging a bootstrap capacitor in a voltage converter having a high-side transistor and a low-side transistor connected in series and switched by a high-side driver and a low-side driver respectively, the bootstrap capacitor being connected between a source of the high-side transistor and a high-side power input of the high-side driver, the circuit comprising:
   a first transistor connected between the bootstrap capacitor and a feedback node, for being switched synchronously with the low-side transistor;
   a dedicated comparator for comparing a feedback voltage drawn from the feedback node with a reference voltage, to produce a control signal, the dedicated comparator being operable without a compensation circuit; and
   a second transistor controlled by the control signal, for determining to connect a supply voltage to the feedback node to charge the bootstrap capacitor.

2. A circuit for charging bootstrap capacitor in a voltage converter having a high-side transistor and a low-side transistor connected in series and switched by a high-side driver and a low-side driver respectively, the bootstrap capacitor being connected between a source of the high-side transistor and a high-side power input of the high-side driver, the circuit comprising:
   a first transistor connected between the bootstrap capacitor and a feedback node, for being switched synchronously with the low-side transistor;
   a comparator for comparing a feedback voltage drawn from the feedback node with a reference voltage, to produce a control signal; and
   a second transistor controlled by the control signal, for determining to connect a supply voltage to the feedback node to charge the bootstrap capacitor;
   wherein the comparator is a hysteretic comparator.

3. The circuit of claim 1, further comprising a voltage divider for dividing a voltage on the feedback node to produce the feedback voltage.

4. The circuit of claim 1, wherein the first transistor is a MOSFET or WET.

5. The circuit of claim 1, wherein the second transistor is a MOSFET or JFET.

* * * * *